United States Patent [19]

Vyne et al.

[11] Patent Number: 5,059,921
[45] Date of Patent: Oct. 22, 1991

[54] AMPLIFIER HAVING TWO OPERATING MODES

[75] Inventors: Robert L. Vyne; Thomas D. Petty, both of Tempe, Ariz.

[73] Assignee: Motorola Inc., Schaumburg, Ill.

[21] Appl. No.: 558,927

[22] Filed: Jul. 27, 1990

[51] Int. Cl.[5] ............................................. H03F 3/45
[52] U.S. Cl. ..................................... 330/261; 330/297
[58] Field of Search ............... 330/136, 267, 273, 285, 330/296, 297, 261; 455/127

[56] References Cited

U.S. PATENT DOCUMENTS

| | | |
|---|---|---|
| 4,077,013 | 2/1978 | Morez et al. ..................... 330/267 |
| 4,555,674 | 11/1985 | Palara et al. ..................... 330/267 |

Primary Examiner—James B. Mullins
Attorney, Agent, or Firm—Michael D. Bingham

[57] ABSTRACT

An amplifier having an input and output stage for providing drive current to a load coupled thereto includes circuitry that senses when an input signal is applied to the amplifier and is responsive thereto for providing an enabling signal at an output thereof and current regulator circuitry that supplies a low drain current to bias the stages when the amplifier is in a quiescent operating mode absent an applied input signal and that is responsive to the enabling signal for increasing the current supplied to the stages to bias the same in a high bias drain current operating mode.

10 Claims, 3 Drawing Sheets

AMPLIFIER HAVING TWO OPERATING MODES

BACKGROUND OF THE INVENTION

The present invention relates to amplifiers and, more particularly, to monolithic integrated differential and operational amplifiers.

Monolithic differential and/or operational amplifiers are utilized in myriad of applications as is well understood. In the past, it has been a goal to produce amplifiers with low quiescent power consumption but such prior art amplifiers have been defficient in in output drive current and alternating current (AC) performance. In fact, it is still the goal to provide an operational amplifier that has high drive current capability in order to drive low impedance loads while also having minimum bias drain current to reduce power consumption. In portable battery powered applications such as mobile telephones, consumer entertainment systems e.g., radios and video games etc., it is especially important to limit the quiescent power consumption of amplifiers used in such applications.

Most, if not all, high output current operational amplifiers are comprised of an input stage that is coupled to an output stage. In response to an alternating input signal being applied to the input stage, the operational amplifier both sources and sinks drive current to and from a load coupled to the output stage. Typically, the input and output stages are biased to a quiescent drain current to permit quality audio and data processing applications. For example, low power, high output current amplifiers such as the MC 33178 manufactured by Motorola, Inc. draw approximately 420 microamperes of drain current per amplifier in the quiescent operating mode with no input signal applied thereto. For micro-power and battery powered applications there is a need to reduce drain current requirements over the foregoing while providing amplifiers that can supply high load currents.

Hence, a need exists for differential and/or operational amplifiers that have reduced drain current requirements over the prior art, absence an applied input signal, but which are responsive to an input signal to provide high load current.

SUMMARY OF THE INVENTION

Accordingly, it is an object of the present invention to provide an improved amplifier.

It is another object of the invention to provide an amplifier that is operated both in a low quiescent current drain and a high active current drain operating mode depending upon the occurrence of an applied input signal thereto.

Still another object of the invention is to provide a circuit for sensing a current proportional to a load current supplied by an operational amplifier to a load to control the magnitude of the bias current drawn by the amplifier.

In accordance with the above and other objects there is provided an amplifier having an input and output stage for providing drive current to a load coupled thereto which comprises circuitry that senses when an input signal is applied to the amplifier and is responsive thereto for providing an enabling signal at an output thereof and current regulator circuitry that supplies a low drain current to bias the input and output stages when the amplifier is in a quiescent operating mode absent an applied input signal and that is responsive to the enabling signal for increasing the current supplied to said input and output stages to bias the same in a high bias drain current operating mode.

DETAILED DESCRIPTION OF THE PREFERRED EMBODIMENT

Figure 1:
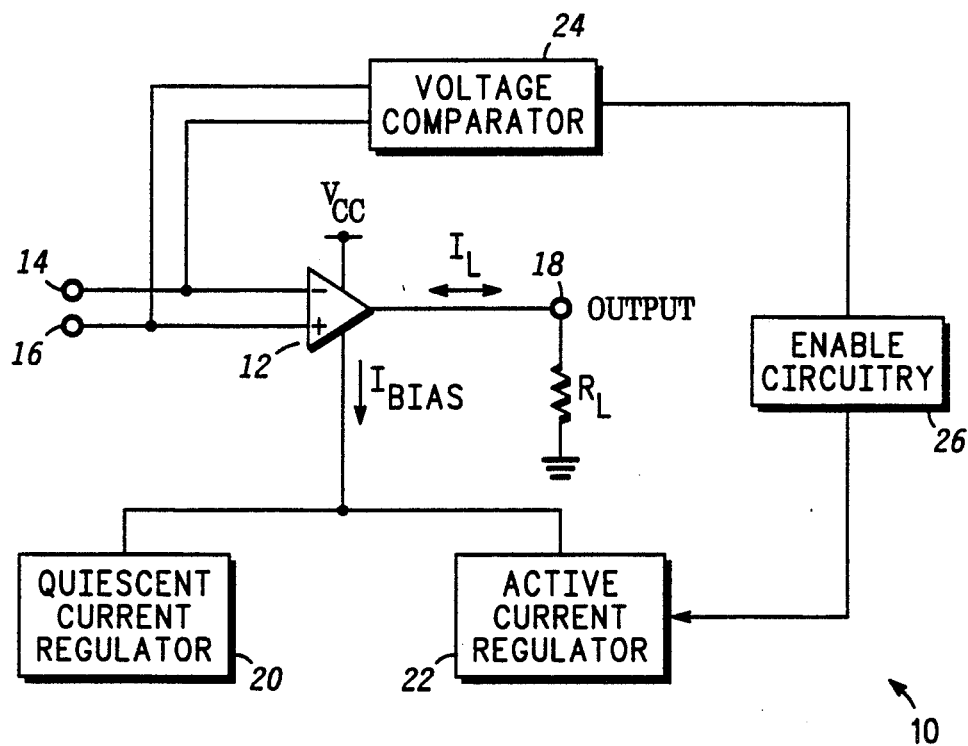
FIG. 1 is a partial block and schematic diagram of the amplifier of one embodiment of the present invention.
Figure 2:
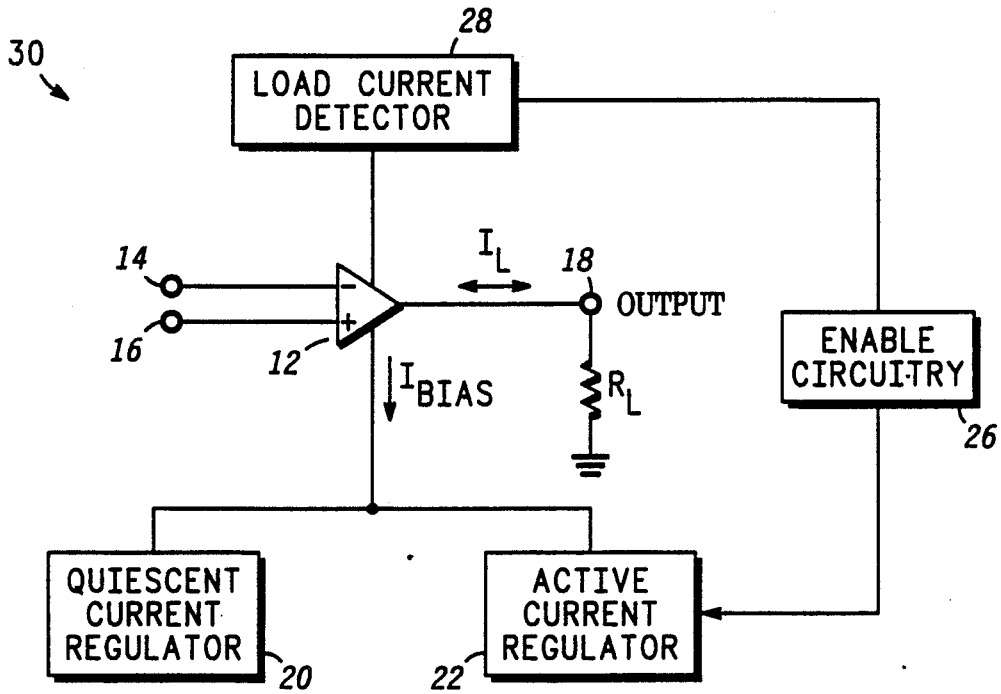
FIG. 2 is a partial block and schematic diagram of the amplifier of another embodiment of the present invention.
Figure 3:
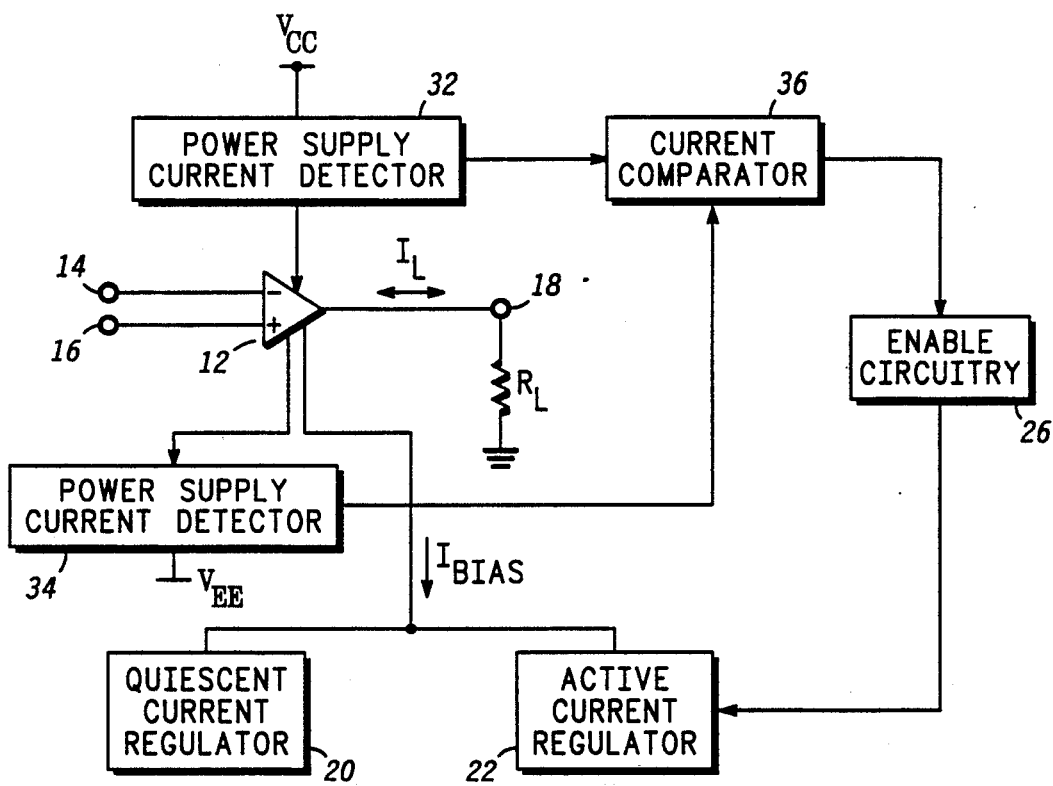
FIG. 3 is a partial block and schematic diagram of the amplifier of yet another embodiment of the present invention.

Referring to FIGS. 1-3, there are shown three embodiments of the amplifier of the present invention including an operational amplifier having two operating modes in accordance with the teachings herein. Amplifiers 10, 30 and 40 each include circuitry responsive to an applied input signal for operating the operational amplifier in a high drain bias current mode and in the absence of an applied input signal maintaining the operational amplifier in a low drain bias current quiescent operation mode. It is understood that the amplifiers are suited to be manufactured in integrated circuit form using, for example, conventional bipolar fabrication processes. In addition, like components between Figures are designated by the same reference numerals.

Turning to FIG. 1, there is illustrated amplifier 10 comprising a conventional operational amplifier 12 and additional associated circuitry for controlling the operating state of the operational amplifier by placing the operational amplifier in either a low quiescent drain current mode ("sleep mode") or a high drain current mode ("awake mode") of operation, i.e., a two state operated amplifier. Typically, operational amplifier 12 is responsive to an input signal applied at differential inputs 14 and 16 for supplying a high drive current, $I_L$, at output 18 to a load $R_L$. Generally, operational amplifier 12 includes a differential input stage for receiving the differential input signal, an intermediate stage coupled between the input stage and an output stage the latter of which is coupled to output 18 for both sinking and sourcing the load current. Although not shown, the aforementioned MC 33178 operational amplifier is typical of the type of operational amplifier being disclosed and includes the stages as aforedescribed. Amplifier 10 further includes regulating circuitry comprising quiescent current regulator 20 and active current regulator 22 for supplying the bias current $I_{Bias}$ to the stages of operational amplifier 12. A voltage comparator 24 is coupled to the respective inputs 14 and 16 of amplifier 10 and has an output coupled to enable circuitry 26 the latter of which has an output coupled to an enable input of active current regulator 22.

In operation, in the absence of an applied input signal, amplifier 10 is biased in the "sleep" or quiescent operating mode. In this sleep mode, active current regulator is disabled and only quiescent current regulator 22 supplies a low drain current $I_{Bias}$ for biasing the particular stages of operational amplifier 12. The magnitude of the quiescent or sleep mode drain current may be on the order of 20 microamperes. This is sufficient bias drain current to maintain the amplifier functional in order to respond to the input signal. When voltage comparator 24 detects the presence of a differential input signal at the inputs of amplifier 10 it supplies a control signal for activating enable circuitry 26. As enable circuitry 26 is activated an enable signal is supplied to active current regulator 22. In response to being enabled, active current regulator 22 sinks additional bias current to increase the magnitude of $I_{Bias}$ to a higher bias drain current level to operate the stages in the higher "awake" or active mode to supply the high output current to load $R_L$.

Hence, what has been described is a two state operational amplifier that is operated in a low bias drain state or sleep mode in the absence of an applied input signal and which senses an input signal applied thereto for operating the amplifier in an awake mode or high bias drain current state sufficient to provide high load current and high frequency capabilities.

Turning to FIG. 2, there is illustrated amplifier 30 of the preferred embodiment which operates in the two operating modes as described above with respect to amplifier 10. Amplifier 30 is responsive to the input signal applied to inputs 14 and 16 and senses a current that is proportional to a change in the load current $I_L$ by curret detector 28 which is coupled to the output stage of operational amplifier 12 to control the operation of enable circuitry 26.

Thus, as described above, active current regulator 22 is enabled in response to an applied input signal causing the load current $I_L$ to exceed a predetermined threshold value.

Similarly, amplifier 40 of FIG. 3 operates in a sleep mode and an awake mode in substantially the same manner as described for the amplifiers of FIGS. 1 and 2. In the present case a change in the power supply current is detected by detector 32 responsive to an input signal applied to inputs 14 and 16 rendering the output stage of operational amplifier active to begin to source load current. Detector 32 being coupled between the positive power supply rail to which Vcc is supplied the operational amplifier 12 senses an increase in the power supply current drain due to the input signal. This increase in current is compared to a reference current by current comparator 36 such that a control signal is generated to enable circuitry 26 to enable regulator 22. Likewise, as load current is sank from output 18, detector 34 senses a change in current in the negative supply rail. This change is detected by current comparator 36 to enable regulator 22 as before.

Figure 4:
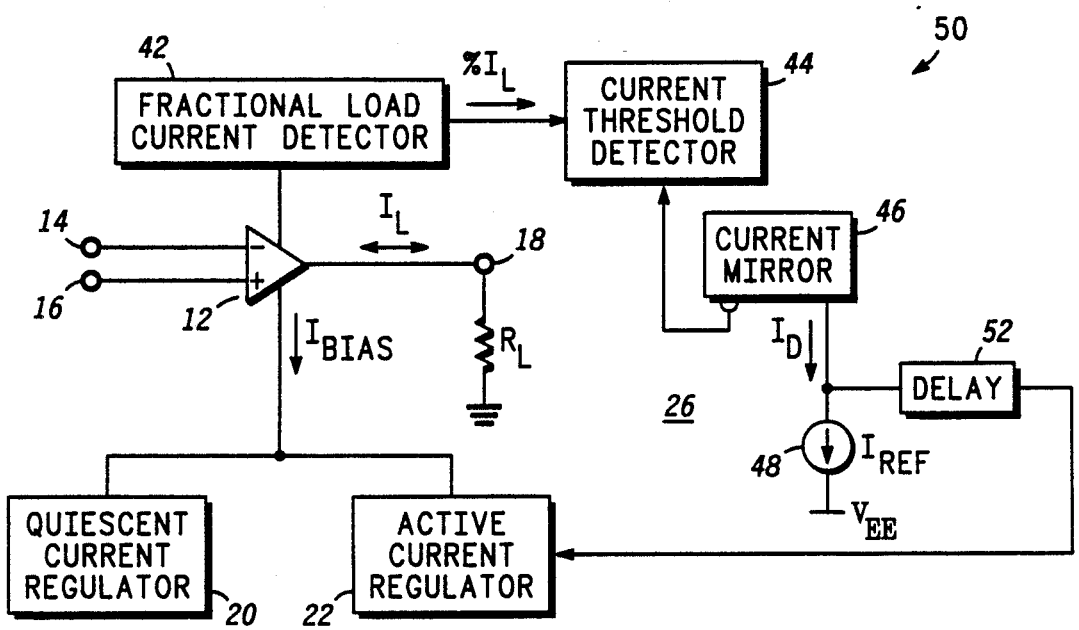
FIG. 4 is a more detailed block and schematic diagram of the amplifier of FIG. 2.

Referring now to FIG. 4, amplifier 50 (which is a more detailed block and schematic diagram of amplifier 30) is shown to more fully explained the preferred embodiment of the invention. A fractional load current detector 42, coupled to the output stage of operational amplifier 12, is utilized to sense the load current therethrough to provide an output current at its output that is proportional to a fraction of the load current. The output of detector 42 is coupled to an input of current threshold detector 44. Current threshold detector 44 has an additional input terminal coupled to an input of current mirror 46 the output of which is coupled both to reference current supply 48 and an input of delay circuit 52. An output of delay circuit is coupled to the enable input of active current regulator 22.

Again, as power is supplied to amplifier 50, quiescent current regulator 20 is activated to supply quiescent drain bias current through the stages of operational amplifier 12. Hence, $I_{Bias}$, is at some nominal value, e.g., 20 microamperes. This sleep mode of operation of amplifier 50 therefore requires minimum drain bias current, sufficient to permit operational amplifier 12 to be responsive to an input signal applied to inputs 14 and 16. Since there is no load current during the sleep mode of operation the output of detector 42 is essentially zero. Current threshold detector 44 therefore remains in the low drain current state and does not supply an input current to current mirror 46; hence, $I_D$ is zero. Delay circuit 52 is thus rendered inoperative and does not supply an enabling signal to current regulator 22. However, in response to the input signal being applied to inputs 14 and 16, load current $I_L$ will begin to be either sourced or sank at output 18. Detector 42 senses a fraction of this load current and provides an output current, % $I_L$ that is proportional to the actual current $I_L$. As soon as this output current exceeds a predetermined value as set by current threshold detector 44 input current is supplied to current mirror 46. Current mirror 46 will then source the current $I_D$ at its output. Once the magnitude of $I_D$ exceeds $I_{REF}$ delay circuit 52 will become operative to supply an enabling signal to active current regulator 22. As active current regulator 22 is enabled additional bias current IBias is then supplied to bias operational amplifier 12 in the high drain bias state and the operational amplifier is then in an awake mode to supply high output load current in a conventional manner. The enabling signal provided by delay circuit 52 will remain on for a predetermined time, is delayed, after the input signal becomes zero. This will prevent distortion in the output signal whenever the alternating input signal crosses zero between alternating half-cycles.

Figure 5:
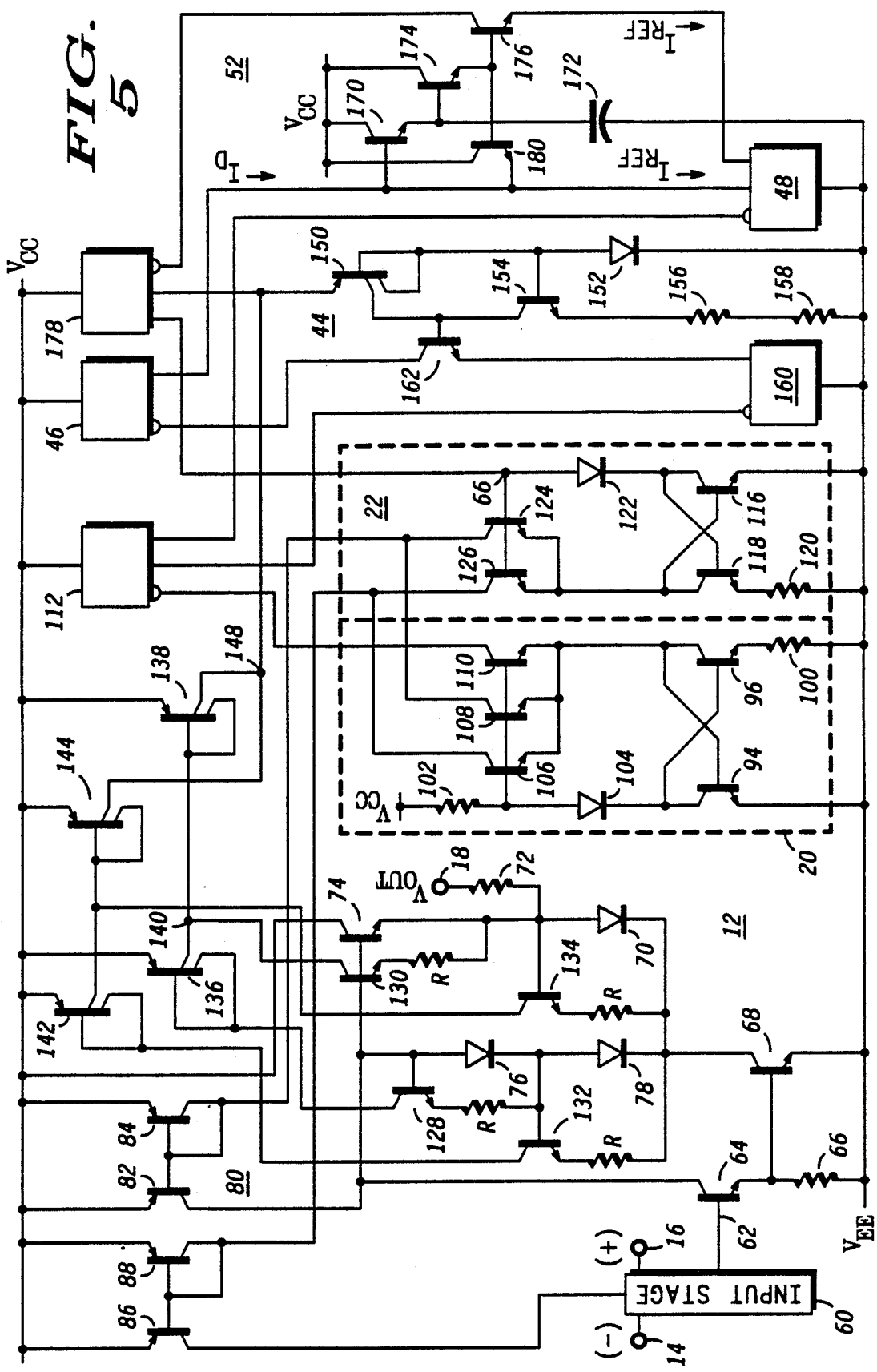
FIG. 5 is a detailed schematic diagram of the amplifier of FIG. 4.

Turning now to FIG. 5, the two operating mode amplifier of the present invention is shown in greater detail. Operational amplifier section 12 of the amplifier is shown as including a differential input stage 60 for receiving differential input signals at inputs 14 and 16 and providing a single ended output signal to an intermediate stage comprising transistor 64 and resistor 66 the latter of which is coupled between the emitter of the former and negative supply rail $V_{EE}$. Transistor 64 is configured as an emitter-follower having its collector coupled to current supply 80. The collector and emitter of transistor 64 are coupled to respective inputs of the output stage of operational amplifier 12 comprising load current sinking output transistor 68, diode 70, series connected diodes 76 and 78 and current sourcing output transistor 74 all of which are interconnected in a known manner. Both current sinking transistor 68 and current sourcing transistor 74 of the output stage are coupled to output terminal 18 through resistor 72. As aforedescribed, operational amplifier is conventional in structure with the several stages thereof being biased in a quiescent bias or sleep mode by current regulator 20 as will be now described.

Current regulator 20 comprising cross coupled transistors 94 and 96, resistors 100 and 102, diode 104 and output transistors 106, 108 and 110 is well known. For example, U.S. Pat. No. 4,491,780, teaches the structure and operation of both regulator 20 and 22. Briefly, a $\Delta V_{BE}$ voltage is established across resistor 100 which sets the output current flowing through the collector-emitter conduction paths of transistors 106, 108 and 110.

Thus, the quiescent bias drive current $I_{Bias}$ is supplied to the appropriate stages of operational amplifier 12 through transistors 106 and 108. Hence, the collector of transistor 106 is coupld to a current mirror comprising diode-connected transistor 88 and transistor 86. As transistor 106 sinks current from the emitter-collector conduction path of transistor 88 current is mirrored through transistor 86 to bias input stage 60 in a quiescent operating state. Similarly, current mirror 80, comprised of diode-connected transistor 84 and transistor 82, is responsive to transistor 108 sinking current from transistor 84 to supply quiescent bias current from the collector of transistor 82 to the collector of transistor 64 as well as the output stage to supply quiescent current therethrough.

Now then, in the quiescent or sleep mode of operation, input stage 60 renders emitter-follower transistor 64 conductive to sufficiently allow transistor 68 to be turned on. Devices 70, 74 76 and 78 are ideally matched. In the sleep mode state, $I_L$ being zero, the sum of the voltage drop across the base-emitter of transistor 74 and diode 70 is equal to the sum of the voltage drop across diodes 76 and 78. Fractional load current detector 42 is illustrated as including four sensing transistors 128, 130, 132 and 134 and respective resistors R as well as current mirrors 136, 138, 142 and 144. As will be more fully described later, transistors 128 and 130 are utilized to sense the presence of load current being sourced to output 18 via transistor 74 and resistor 72 while transistors 132 and 134 sense load current flow from output 18 through transistor 68. As shown the bases of transistors 128 and 130 are commonly connected at the anode of diode 76 and the base of output transistor 74 while the emitter of the transistor 128 is connected via resistor R to the anode of diode 78 and the emitter of transistor 130 is coupled via respective resistor R to the anode of diode 70. The collector of transistor 128 is returned to the input of a current mirror formed by multi-collector transistor 136 in a conventional manner, the output of the current mirror (the second collector of transistor 136) being coupled to node 140 and to the collector of transistor 130. Node 140 is also coupled to the input of the current mirror formed by mutli-collector transistor 138 the output of which is connected to node 148. In a similar manner the base-emitter of transistor 132 is coupled, via resistor R, across diode 78 while the base-emitter of transistor 134 is coupled across diode 70 via resistor R. Further, the collector of transistor 132 is coupled to the input (the first collector of transistor 142) of the current mirror formed by multi-collector transistor 142 the output of the latter being coupled both to the collector of transistor 134 and the input of the current mirror formed by multi-collector transistor 144. The output of the current mirror formed by transistor 144 is connected in common at node 148 to the output of the current mirror formed by transistor 138 and to the input of current threshold detector or switch 44 at the emitter of transistor 150.

Current threshold detector 44 includes multi-collector transistor 150 the emitter of which is coupled to node 148 as well as one output of current mirror 178. A first collector of transistor 150 is interconnected to its base and is coupled both to the negative supply rail via diode 152 and to the base of transistor 162. The collector of transistor 162 is coupled to the input of current mirror 46 the output of the latter being coupled to current reference source 48, the emitter of transistor 162 is coupled to the output of current mirror 160 (which supplies a constant current) while the input of the current mirror is coupled to an output of current mirror 112. One output of current mirror 178 is coupled to the input node 66 of regulator 22 while its input is coupled to the collector of transistor 176 of delay circuit 52. Delay circuit 52 further includes transistor 170 the base of which is coupled both to the output of the current mirror forming current reference 48 and to the output of current mirror 46 while its emitter is coupled to the base of transistor 174 and one electrode of capacitor 172, the other electrode of which is returned to $V_{EE}$. The collectors of transistors 170 and 174 are returned to $V_{CC}$ and the emitter of transistor 174 is coupled both to the base of transistor 176 and the base of transistor 180. The emitter of transistor 176 is coupled to an output of current mirror 48. The collector of transistor 180 is returned to $V_{CC}$ while its emitter is coupled with the base of transistor 170 to the other output of current mirror 48.

In the quiescent or sleep mode operating state the bias current flowing through transistor 74 equals that flowing through diode 76 and similarly the current through diode 70 is equal to that of diode 78. In this state, transistors 128 and 130 are equally biased such that the current mirrored at the second collector of transistor 136, due to the current sank at its interconnected collector and base by transistor 128, is completely sank by transistor 130. Thus, no current is mirrored by current mirror transistor 138 to node 148. Likewise, current mirror transistor 144 remains inactive as no base current is sourced therefrom as transistor 134 will sink all of the current sourced from transistor 142, due to transistor 132, and no current is mirrored to node 148 from the output collector of transistor 144. Thus, a unique feature of current detector circuit 42 is to subtract out the quiescent current from the fractional load current that is detected. Since no current is source to node 148 from current detector 42 when the load current is zero (either if the amplifier is in a sleep mode or awake mode, transistor 150 is rendered non-conductive and current threshold detector 44 is inactive. In this state transistor 162 is non-conductive and does not sink input current from current mirror 46. However, as current mirror 112 has input current supplied thereto through transistor 110, an output current is sourced to the input of current reference 48 which in turns wants to sink the current $I_{REF}$ at its outputs. Because current mirror 46 is inactive, $I_D$ is zero whereby delay circuit 52 is also inactive as transistor 170 remains in an off condition since there is no base current drive available thereto. Hence, transistors 174, 176 and 180 will be turned off. Since there is no input current supplied to current mirror 178 in this condition active current regulator will remain in a disabled state as there is no output current supplied to node 66 from current mirror 178.

In brief summary, in the quiescent or sleep mode operating state of anplifier 50, regulator 20 supplies the quiescent bias currents to the stages of operational amplifier 12. Since, there is no load current supplied at output 18, load current detector provides no current output to current threshold detector 44 which is thus rendered inactive which in turn disables delay circuit 52. Hence, operational amplifier 12 is maintained in a sleep mode since current regulator 22 is disabled but is ready to respond to an applied input signal while drawing minimum bias current.

As now will be described, in response to an input signal being applied at inputs 14 and 16, amplifier 50 will be placed in an awake mode by active current regulator being enabled to provide additional bias current to the stages of operational amplifier 12.

Responsive to an alternating differential input signal, either output transistor 68 will be turned harder on to sink current from output 18 during one half of the alternating input signal, and will tend to be turned off during the other half of the alternating input signal while output transistor 74 is turned harder on to source current to output 18. Assuming first that transistor 68 is turned on harder by transistor 64 being rendered conductive, transistor 74 will tend to be turned off as base current drive thereto is shunted by transistor 68. Load current is thus sourced from output 18 through diode 70 which increases the voltage drop across the diode. This, in turn, causes sensing transistor 134 to be turned on to also sink a fractional amount of the load current therethrough depending on the ratio of its emitter area with respect to the emitter area of the diode-connected transistor forming diode 70. For example, if diode 70 has an emitter area eigth times greater than that of transistor 134, approximately one eighth of total load current flowing through transistor 68 flows through transistor 134 depending on the resistance of the resistor R. However, the voltage drop across diodes 76 and 78 remains constant. Hence, transistor 134 is more conductive than transistor 132 and wants to sink more current than can be supplied from the output of current mirror transistor 142 at its second collector. This additional current is however supplied by current mirror transistor 144 wherein the sum of the currents supplied by transistors 142 and 144 is equal to the fractional load current sunk by transistor 134. Transistor 144 mirrors this current to supply a current, proportional to the fractional load current, to node 148 and to current threshold detector 44.

The current sourced to transistor 150 is evenly split between the collectors thereof and sourced to diode 152 and to the collector of transistor 154. By emitter area ratioing of transistor 154 and the diode-connected transistor forming diode 152, transistor 154 remains saturated until the magnitude of the current sourced to node 148 increases to a predetermined value. For instance, if the emitter area of transistor 154 is made 4 times greater than the area of diode connected transistor 152, transistor 154 remains saturated until the voltage across resistors 156 and 158 reaches approximately 36 millivolts (depending on the resistances thereof). As long as transistor 154 is saturated, transistor 162 is biased off as all of the current is sank through the former. Thus, no input current is supplied to current mirror 46 and therefore no output current is source to input of delay circuit 52 to activate regulator 22. However, once the value of the current source to node 148 from transistor 144 exceeds the value necessary to forward bias the base of transistor 154 it is no longer in a saturated state and base current drive is provided to transistor 162. Transistor 162 is therefore turned on to pass the current required by current mirror 160 from current mirror 46, the current sourced from the input of current mirror 46 is mirrored to provide the current $I_D$. Once $I_D$ exceeds $I_{REF}$, transistor 170 is turned on to being charging capacitor 172. Transistors 174, 176 and 180 will remain in a non-conductive state and current regulator 22 is maintained in its disabled state. As soon as the voltage across capacitor 172 reaches a value to forward bias transistor 174 it begins to conduct thereby turning transistors 176 and 180 on. Transistor 176 then passes the input current sourced from current mirror 178 to current mirror 48. Current mirror 178 then supplies an output current to input node 66 which now enables active current regulator 22. As current regulator 22 is enabled additional bias current is supplied to the stages of operational amplifier 12 through transistors 124 and 126. Operational amplifier 12 is therefore placed in its active or awake mode of operation. In a like manner, on the alternating half cycle of the input signal to operational amplifer 12, transistor 74 is rendered more conductive in response to the input signal which causes transistor 130 to sink a fractional amount of the load current sourced to output 18. Transistor 130 will then will want to sink more current than is supplied by current mirror transistor 136. The additional current required by transistor is drawn from the bas-collector of transistor 138. Current mirror transistor 138 is thus rendered conductive to supply the additonal collector current of transistor 130. The fractional load current sunk by transistor 130 is then mirrored by transistor 138 to node 148. The aforedescribed operation of current threshold detector is repeated on the alternating half cycle of the input signal. It is important to note that the enabling signal from delay circuit 52 is not interrupted as the input signal crosses from one alternating half-cycle to the next as capacitor 172 does not have time to discharge sufficiently to turn off transistor 176.

Once the input signal is removed, capacitor 172 will discharge which eventually turns transistors 174, 176 and 180 off as the voltage across the capacitor decrease below the value needed to maintain the transistors in a forward biased condition to thereby remove the enabling signal from current mirror 178. Current regulator 22 will then become disabled and amplifier 50 is returned to its sleep mode as long as the operating potentials are supplied thereto. It is noted that transistor 180 prevents transistor 170 from zenering as $I_D$ goes to zero while the voltage across capacitor 172 is at its peak value. In addition, hysteresis is provided to maintain current threshold detector 44 active until the output current from detector 42 falls below the value required to activate threshold detector 44. This hysteresis is provide by the additional current supplied to node 148 from the output of current mirror 178. As soon as delay circuit 52 is rendered operative the additonal current will be supplied to the emitter of transistor 150 and, which due to the gain of the circuit, will quickly drive transistor 162 to conducting state. Now, the magnitude of the current sourced to node 148 from load current detector circuit 42 must decrease below the predetermined value required to turn on transistor 162 before the latter can be turned off.

Hence, what has been described above is a novel active two state operational amplifier and circuitry for maintaining the amplifier in a sleep mode of operation absent an applied differential input signal whereby minimum quiescent bias current is dissipated and which is responsive to an applied input signal for operating in an awake mode to permit improved performance of the operational amplifier at higher current drain.

What is claimed is:

1. An amplifier having an input and an output stage for supplying an output current drive at an output thereof responsive to an applied input signal, comprising:

current regulator circuitry for providing quiescent bias current to the input and output stages of the amplifier for maintaining the amplifier in a quiescent operating mode absent the applied input signal and being responsive to an enabling signal for providing additional bias current to the input and output stages for biasing the stages in an active operating mode wherein the amplifier is operated in two states; and circuit means for sensing a fractional portion of the output current drive in response to the input signal being applied to the amplifier for providing said enabling signal to said current regulator circuit while substantially inhibiting said enabling signal in the absence of the applied input signal.

2. The amplifier of claim 1 wherein said current regulator circuitry includes:

a first current regulator coupled to the stages of the amplifier for providing said quiescent bias current; and a second current regulator coupled in parallel to said first current regulator and having a control input for receiving said enabling signal for providing said additional bias current.

3. The amplifer of claim 2 wherein said circuit means includes:

a current detector circuit for sensing a fraction of the output current drive for providing an output current at an output thereof that is proportional to a fraction of the output current drive;

a current threshold detector responsive to said output current from said current detector exceeding a predetermined value for providing an output signal therefrom; and a delay circuit responsive to said output signal for providing said enabling signal, said enabling signal being maintained a predetermined time after the input signal becomes zero.

4. A method for operating an operational amplifier having a plurality of amplifying stages in a quiescent bias current state in the absence of an applied input signal and for operating the amplifier in an increased bias current state in response to an applied input signal, comprising the steps of;

providing quiescent bias current to the plurality of amplifying stages of the amplifier;

sensing a fraction of a load current supplied at the output of the amplifier to a load coupled thereto in response to the input signal being applied to the amplifier;

providing a current that is proportional to said fraction of the load current only during the presence of the applied input signal; and detecting when said current proportional to the fraction of load current exceeds a predetermined value to provide additional bias current to the plurality of amplifying stages of the amplifier.

5. An amplifier for sourcing and sinking load current at an output thereof and having first and second inputs to which a differential alternating signal is supplied, comprising:

an operational amplifier stage including an input stage and an output stage and having first and second differential inputs respectively coupled to said first and second inputs of the amplifier and an output corresponding to the output of the amplifier;

quiescent current bias means for supplying quiescent bias drain current to bias said operational amplifier stage in a quiescent operating mode in the absence of an input signal being applied to said first and second differential inputs of said operational amplifier stage;

current bias means for supplying addition bias drain current in parallel with said quiescent bias drain current to said input and output stages of said operational amplifier stage to bias said operational amplifier stage in an active operating mode responsive to an enabling signal applied to said current bias means;

circuit means for sensing a fraction of the sourcing and sinking load current supplied at the output of the amplifier and providing an output current proportional to said fraction of load current at an output;

a threshold detector circuit responsive to said output current of said circuit means for providing a control signal when said output current exceeds a predetermined value; and a delay circuit responsive to said control signal exceeding a predetermined value for providing said enabling signal during the presence of the input signal and for a predetermined time after the input signal is not present.

6. The amplifier of claim 5 wherein said circuit means for sensing a fraction of the load current includes:

first current mirror means having an input and an output;

second current mirror means having an input and an output, said input being coupled to said output of said first current mirror means and said output being coupled to the output of said circuit means for sensing a fraction of the load current;

first transistor circuit means for supplying a substantially constant input current to said input of said first current means;

second transistor circuit means coupled to said output of said first current mirror means through which a portion of the load sourcing current flows;

third current mirror means having an input and an output;

fourth current mirror means having an input and an output, said input being coupled to said output of said third current mirror means and said output being coupled to the output of said circuit means for sensing a fraction of the load current;

third transistor circuit means for supplying a substantially constant input current to said input of said third current means; and fourth transistor circuit means coupled to said output of said third current mirror means through which a portion of the load sinking current flows.

7. The amplifer of claim 6 wherein said threshold detector circuit includes:

a multi-collector transistor having first and second collectors, a base and an emitter, said emitter being coupled to said output of said circuit means for sensing a fraction of the load current, said first collector and said base being interconnected;

diode means coupled between said base of said multi-collector transistor and a first power supply conductor;

a first transistor having a collector, a base and an emitter, said collector being coupled to said second collector of said multi-collector transistor, said base being coupled to said first collector;

resistive means coupled between said emitter of said first transistor and said first power supply conductor;

a second transistor having a collector, a base and an emitter, said base being coupled to said second collector;

current supply means coupled to the emitter of said second transistor for sinking current therefrom; and fifth current mirror means having an input coupled to said collector of said second transistor and an output to which is provided said control signal.

8. The amplifier of claim 7 including:

a sixth current mirror means having an input coupled to said quiescent current bias means and an output, said sixth current mirror means being responsive to said current bias means for providing a current at said output;

a reference current supply coupled to said output of said sixth current mirror for sinking a reference current.

9. The amplifier of claim 8 wherein said delay circuit includes:

a third transistor having a base coupled to said output of said fifth current mirror means, a collector coupled to a second power supply conductor, and an emitter;

a capacitor coupled between said emitter of said third transistor and said first power supply conductor;

a fourth transistor having a base coupled to said emitter of said third transistor, a collector, and an emitter coupled to said reference current supply; and a seventh current mirror means having an input coupled to said collector of said fourth transistor and an output to which said enabling signal is provided, said output being coupled to said current bias means.

10. An amplifier responsive to an input signal applied thereto for providing output drive current at an output thereof, comprising:

an input stage to which the input signal is applied;

an output stage coupled to the input stage for providing the output drive current;

circuit means coupled with said output stage for sensing a portion of the output drive current to provide an enabling signal; and bias circuit means for biasing said input stage and said output stage of the amplifier in a quiescent operating mode absent the applied input signal and being responsive to said enabling signal for biasing the amplifier in an active operating mode.

* * * * *

UNITED STATES PATENT AND TRADEMARK OFFICE
CERTIFICATE OF CORRECTION

PATENT NO. : 5,059,921

DATED : October 22, 1991

INVENTOR(S) : Robert L. Vyne and Thomas D. Petty

It is certified that error appears in the above-identified patent and that said Letters Patent is hereby corrected as shown below:

In column 9, claim 1, line 9, change "circuit" to --circuitry--.

Signed and Sealed this

Thirtieth Day of March, 1993

Attest:

STEPHEN G. KUNIN

Attesting Officer

Acting Commissioner of Patents and Trademarks